United States Patent
Gill

(10) Patent No.: US 6,195,240 B1
(45) Date of Patent: Feb. 27, 2001

(54) SPIN VALVE HEAD WITH DIFFUSION BARRIER

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/127,254

(22) Filed: Jul. 31, 1998

(51) Int. Cl.[7] ..................................... G11B 5/39
(52) U.S. Cl. ............................ 360/324.12; 360/324.11
(58) Field of Search .......................... 360/113, 324.1, 360/324.11, 324.12, 324, 324.2

(56) References Cited

U.S. PATENT DOCUMENTS

| 5,484,491 | 1/1996 | Iwasaki et al. ............. 148/313 |
| 5,657,191 | 8/1997 | Yuan ....................... 360/113 |
| 5,701,223 | 12/1997 | Fontana, Jr. et al. .......... 360/113 |
| 5,717,550 | 2/1998 | Nepela et al. ............... 360/113 |
| 5,896,252 | * 4/1999 | Kanai ...................... 360/113 |
| 5,909,345 | * 6/1999 | Kawawake et al. . |
| 5,955,211 | * 9/1999 | Maeda et al. . |
| 5,966,012 | * 10/1999 | Parkin . |
| 6,034,847 | * 3/2000 | Komuro et al. . |
| 6,046,892 | * 4/2000 | Aoshima et al. . |
| 6,088,195 | * 7/2000 | Kamiguchi et al. . |

FOREIGN PATENT DOCUMENTS

| 197 01 509 | * 7/1997 | (DE) . |
| 0 758 783 | * 2/1997 | (EP) . |
| 9-199768 | * 7/1997 | (JP) . |

* cited by examiner

*Primary Examiner*—Craig A. Renner
(74) *Attorney, Agent, or Firm*—Robert O. Guillot; Oppenheimer Wolff & Donnelly LLP

(57) ABSTRACT

An improved spin valve sensor (300) having a diffusion barrier (348) interposed between a free layer (318) and a spacer (322) where the spacer (322) is interposed between the free layer (318) and a pinned layer (320) such that diffusion between said free layer (318) and the spacer (322) is effectively prevented during thermal treatment of the improved spin valve sensor (300) during manufacture. The diffusion barrier (348) is an amorphous material having a high GMR. In one embodiment, a high proportion of Cobalt is used to attain desired GMR.

10 Claims, 4 Drawing Sheets

SPIN VALVE HEAD WITH DIFFUSION BARRIER

TECHNICAL FIELD

The present invention relates to the field of spin valve read heads for reading data from rotating magnetic media, and more specifically to a spin valve head having a diffusion barrier to prevent degradation of spin valve performance during thermal treatment of the spin valve head. The predominant current usage of the present inventive spin valve head with diffusion barrier is in high capacity fixed disk data drive mechanisms wherein a read head having high sensitivity is desired.

BACKGROUND ART

Spin valve ("SV") heads (sometimes referred to as giant magneto resistive heads or "GMR" heads) are very attractive for use as high density recording magneto resistive ("MR") rip heads because of their high readback output voltages, linear response, and symmetrical read sensitivity profiles. FIG. 1 shows an air bearing surface view of a prior art SV sensor 10 comprising end regions 12 and 14 separated by a central region 16. A free layer (free ferromagnetic layer) 18 is separated from a pinned layer (pinned ferromagnetic layer) 20 by a non-magnetic, electrically-conducting spacer layer 22 (typically, primarily copper). The magnetization of the pinned layer 20 is fixed through exchange coupling with an antiferromagnetic (AFM) layer 24. The magnetization of the free layer 18, however, is free to rotate in the presence of an external field. Free layer 18, spacer layer 22, pinned layer 20 and the AFM layer 24 are all formed in the central region 16. Hard bias layers 26 and 28 formed in the end regions 12 and 14, respectively, provide longitudinal bias for the MR free layer 18. Leads 30 and 32 formed over hard bias layers 26 and 28, respectively, provide electrical connections for the flow of the sensing current Is, from a current source 34 to the SV sensor 10. A signal detector 40 which is electrically connected to the leads 30 and 32 senses the change in resistance of the SV sensor 10 due to changes induced by the external magnetic field (e.g., the field generated by a when a field transition on a disk is moved past the SV sensor 10. In the example of FIG. 1, a cap 42 is optionally provided.

During the manufacturing of a read/write head for magnetic recording media, the write head may be formed on top of the SV sensor 10. During the manufacture of the write head, and during some of the processes involved in manufacturing the SV sensor 10, itself, high temperature processes have inevitably been involved. (Examples are the photoresist baking of the write head, the annealing of the AFM layer 24 material which is required for some materials, and resetting of the pinned layer 20.) At these temperatures, the grain boundaries of adjacent materials tend to become aligned, notably at the junction of the spacer 22 and the free layer 18 and/or at the boundary of the spacer 22 and the pinned layer 20. In this condition, it is very easy for diffusion between such layers to occur. This results in a degradation of the output signal amplitude produced by the SV sensor 10.

Clearly, it would be desirable to prevent the degradation caused to longer term thermal treatment of the spin valve head during the manufacturing process. However, to the inventor's knowledge, no prior art construction or process has effectively and sufficiently reduced the reduction of spin valve output amplitude caused by such thermal treatment.

DISCLOSURE OF INVENTION

Accordingly, it is an object of the present invention to provide a spin valve which retains high amplitude output even after thermal treatment.

It is still another object of the present invention to provide a spin valve head which is sufficiently sensitive to accurately detect minor flux changes.

It is yet another object of the present invention to provide a spin valve which will withstand thermal treatments during manufacture with a minimum of degradation.

It is still another object of the present invention to provide a spin valve which will can be it readily manufactured.

Briefly, the preferred embodiment of the present invention is a spin valve which has a very thin layer of amorphous metal between the spacer layer and the free layer, thereby removing the grain boundaries between these layers and thus greatly reducing diffusion between these layers during the thermal processes necessary to the manufacture of the spin valve. Thereby, degradation of amplitude output of the spin valve which has normally been caused by these thermal processes is minimized.

An advantage of the present invention is that a spin valve will have a high output amplitude.

A further advantage of the present invention is that thermal processes during manufacture can be tolerated without degradation of amplitude.

Yet another advantage of the present invention is that read head sensitivity is increased. Still another advantage of the present invention is that it is made easier to manufacture spin valve read heads without causing degradation of the finished product.

These and other objects and advantages of the present invention will become clear to those skilled in the art in view of the description of the best presently known mode of carrying out the invention and the industrial applicability of the preferred embodiment as described herein and as illustrated in the several figures of the drawing.

BEST MODE FOR CARRYING OUT THE INVENTION

Figure 2:
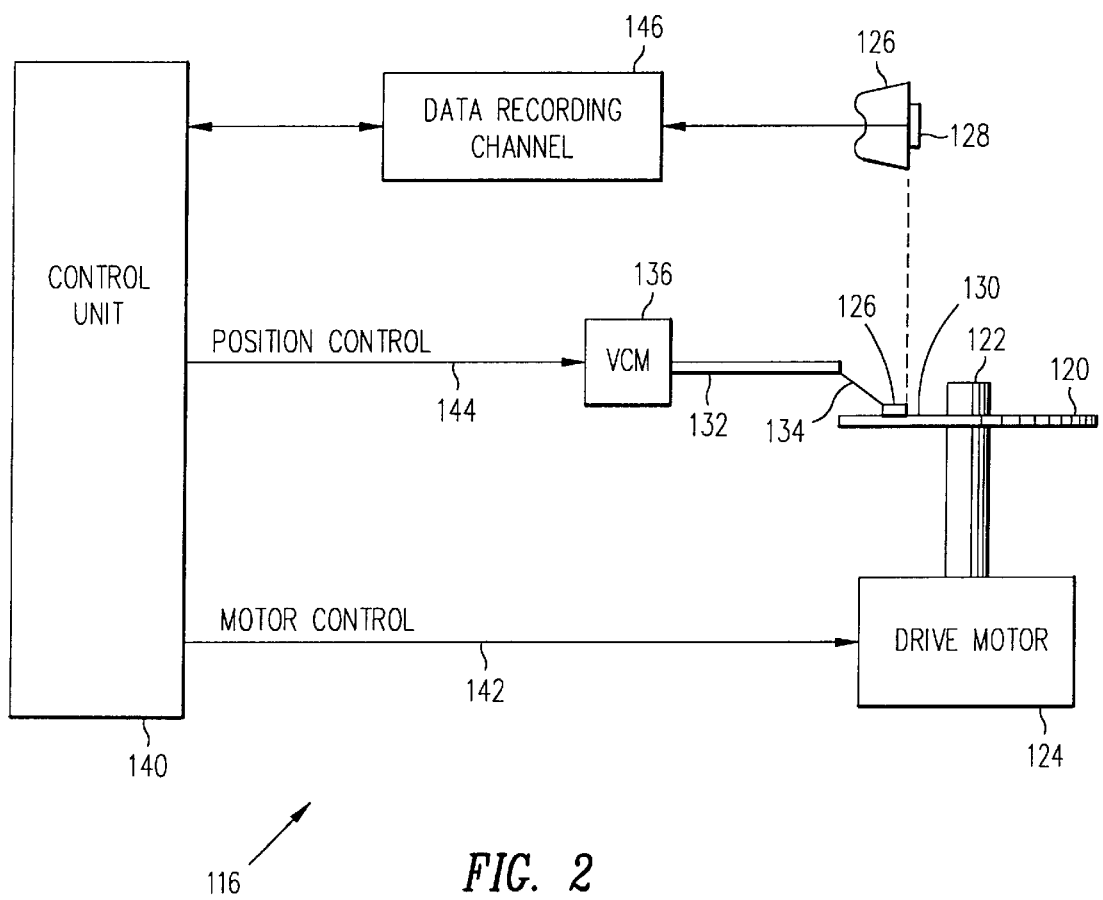
FIG. 2 is a rotating media magnetic disk drive such as might incorporate the present inventive improved spin valve head.

FIG. 2 is a diagrammatic depiction of a disk drive 116. As shown in FIG. 2, at least one rotatable magnetic disk 120 is supported on a spindle 122 and rotated by a disk drive motor 124. The magnetic recording media on each disk 120 is in the form of an annular pattern of concentric data tracks (not shown).

At least one slider 126 is positioned on the disk 120, each slider 126 supporting one or more magnetic read/write heads 128 where the head 128 incorporates the MR sensor of the present invention. As the disk(s) 120 rotate, slider 126 is moved radially in and out over disk surface 130 so that heads 128 may access different portions of the disk 120 where desired data is recorded. Each slider 126 is attached to an actuator arm 132 by means of a suspension 134. The suspension 134 provided a slight spring force which biases slider 126 against the disk surface 130. Each actuator arm 132 is attached to an actuator 136. The actuator 136, as shown in FIG. 2, may be a voice coil motor (VCM). The VCM has a coil movable within a fixed magnetic field, the direction and speed of the coil movements being controlled by the motor current signals supplied by a control unit 140.

During operation of the disk drive 116, the rotation of the disk 120 generates an air bearing between slider 126 and the disk surface 130 which exerts an upward force or lift on the slider 126. The surface of the slider 126, which includes head 128 and faces the surface of disk 120 is referred to as an air bearing surface (ABS). The air bearing thus counterbalances the slight spring force of suspension 134 and, during normal operation, supports the slider 126 off of, and slightly above, the disk surface 130 at a small, substantially constant spacing.

The various components of the disk drive 116 are controlled in operation by control signals generated by a control unit 140, such as access control signals and internal clock signals. Typically, control unit 140 has logic control circuits, storage apparatus, and a microprocessor. The control unit 140 generates control signals to control various system operations such as drive motor control signals on line 142 and head position and seek control signals on line 144. The control signals on line 144 provide the desired current profiles to optimally move and position the slider 126 to the desired data track on the disk 120. Read and write signals are communicated to a from read/write heads 128 through recording channel 146.

Figure 3:
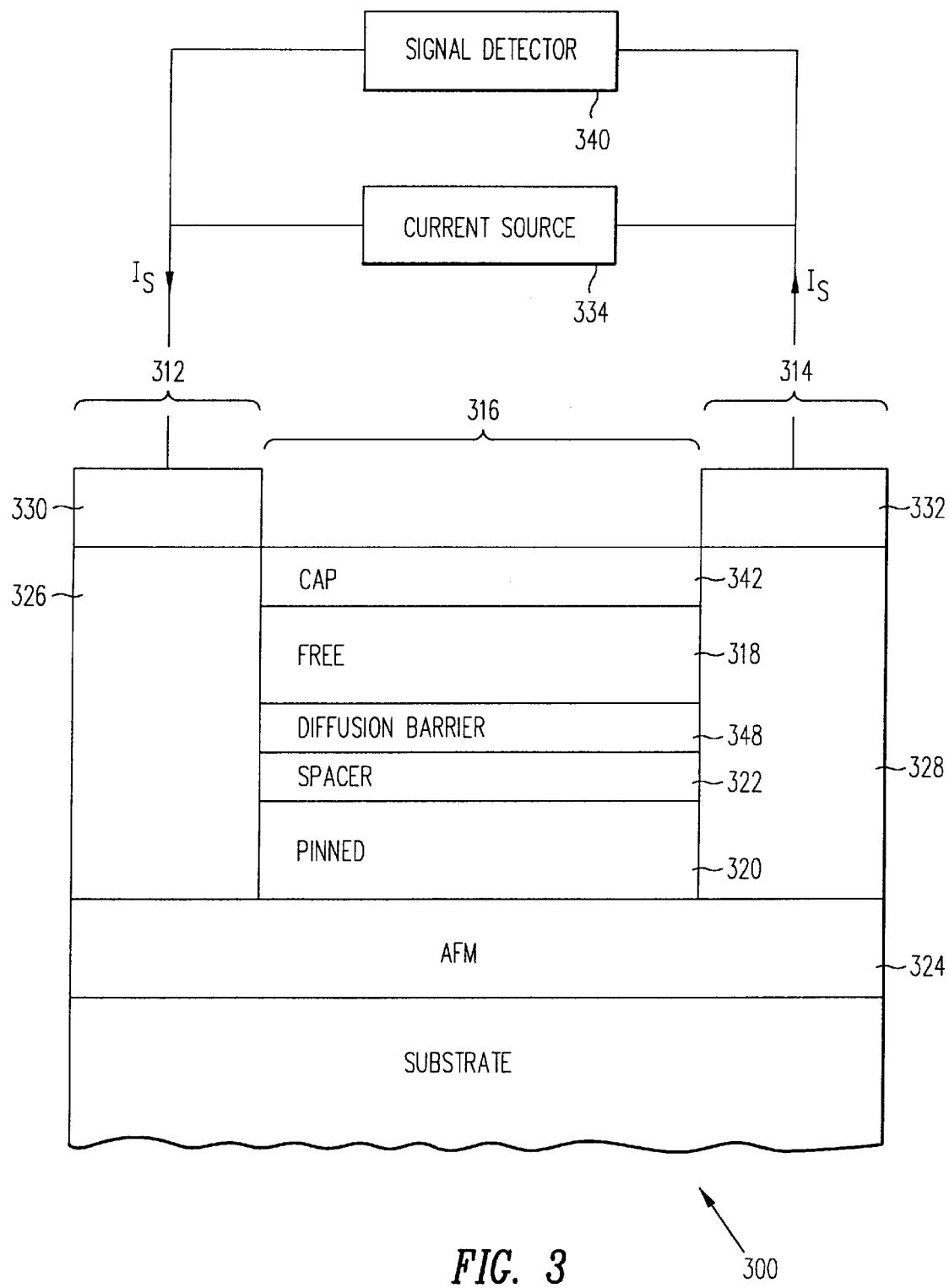
FIG. 3 is an air bearing surface view of an improved spin valve head of the present invention.

The above description of a typical magnetic disk drive 116 storage system, and the accompanying illustration of FIG. 3 are for representation purposes only. It should be apparent that disk storage systems may contain a large number of disks and actuators, and that each actuator may support a number of sliders. Many other variations of the basic typical magnetic disk drive 116 may be used in conjunction with the present invention while keeping within the scope and intention of the invention.

Figure 1:
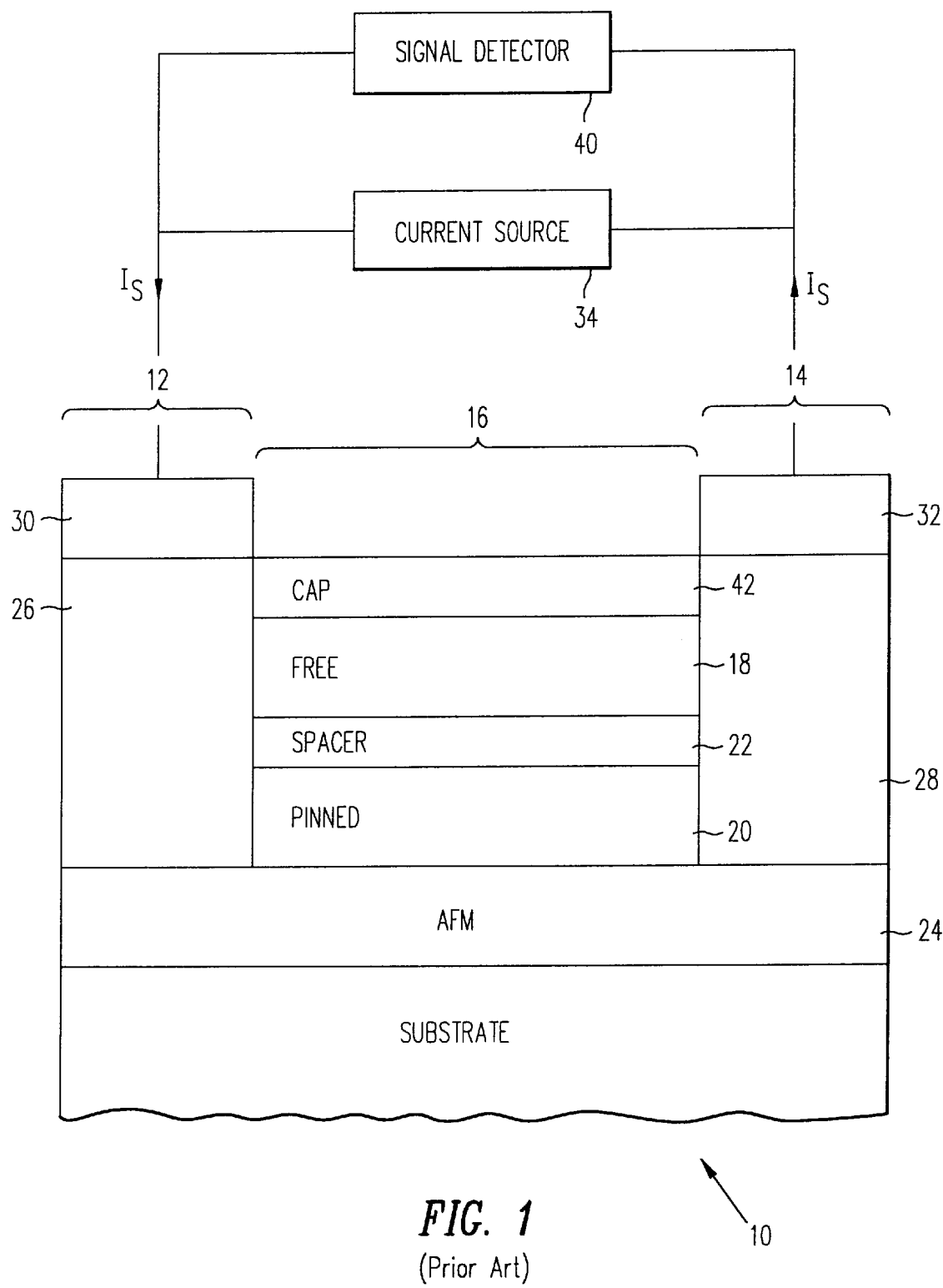
FIG. 1 (prior art) is an air bearing surface view of a conventional spin valve head.

An improved spin valve is depicted in an air bearing surface view in FIG. 3 and is designated therein by the general reference character 300. The improved spin valve 300 is, in many respects similar to the conventional spin valve 10 previously discussed herein in relation to the prior art FIG. 1. The improved spin valve head 300 has end regions 312 and 314 separated by a central region 316. A free layer (free ferromagnetic layer) 318 is separated from a pinned layer (pinned ferromagnetic layer) 320 by a non-magnetic, electrically-conducting spacer layer 322. The magnetization of the pinned layer 320 is fixed through exchange coupling with an antiferromagnetic (AFM) layer 324. The magnetization of the free layer 318, however, is free to rotate in the presence of an external field. Free layer 318, spacer layer 322, pinned layer 320 and the AFM layer 324 are all formed in the central region 316. Hard bias layers 326 and 328 formed in the end regions 312 and 314, respectively, provide longitudinal bias for the MR free layer 318. Leads 330 and 332 which are formed over hard bias layers 326 and 328, respectively, provide electrical connections for the flow of the sensing current Is, from a current source 334 to the SV sensor 300. A signal detector 340 which is electrically connected to the leads 330 and 332 is not substantially different from the signal detector 40 previously described herein in relation to FIG. 1. As in the example of FIG. 1, a cap 342 is optionally provided in the example of FIG. 3.

In the improved SV sensor 300, a diffusion layer 348 is positioned between the spacer 322 and the free layer 318. The diffusion layer 348 of the embodiment depicted is made of CoFeNb, in proportions of approximately 90% Co (cobalt), 5% Fe (iron) and 5% Nb (Niobium).

The high Co concentration used provides an improvement in the GMR coefficient. This material is known to be very soft magnetically and to posses high corrosion resistance. This amorphous material has essentially no grain boundaries and, therefore, diffusion is minimized between the free layer 318 and the spacer 322. The example of the diffusion barrier 348 described herein is approximately between 5 Å and 10 Å in thickness.

Various modifications may be made to the invention without altering its value or scope. For example, the thickness of the diffusion barrier 348 could be varied from that suggested herein. Another example would be to use other elements to make the Co amorphous. These might include Hf (hafnium) and/or Zr (zirconium). It is known in the art to use B (boron) to make Co amorphous. However, it should be noted boron is known to be corrosive.

While the Fe of the combination described herein does not contribute to the GMR, the inventor has found experimentally that as much as 10% Fe does not significantly reduce the GMR, and so variances in that general range could be used.

Other constructions of the improved SV sensor 300 are possible, and one skilled in the art could readily adapt the present invention for use with such alternative constructions. For example, where pinned layers 320 having multiple layers are used multiple iterations of the diffusion barrier 348 could also be employed. It is important to note that in order to illustrate the present invention, the inventive diffusion barrier 348 is shown in the context of the SV sensor 300 which closely resembles the simple prior art, SV sensor 10 of FIG. 1. However, the invention is by no means limited to such constructions. Indeed, it is intended that the diffusion barrier 348 be incorporated, as described herein, into more sophisticated constructions (perhaps containing additional material layers, or the like), both those presently in existence and those to be developed in the future.

Figure 4:
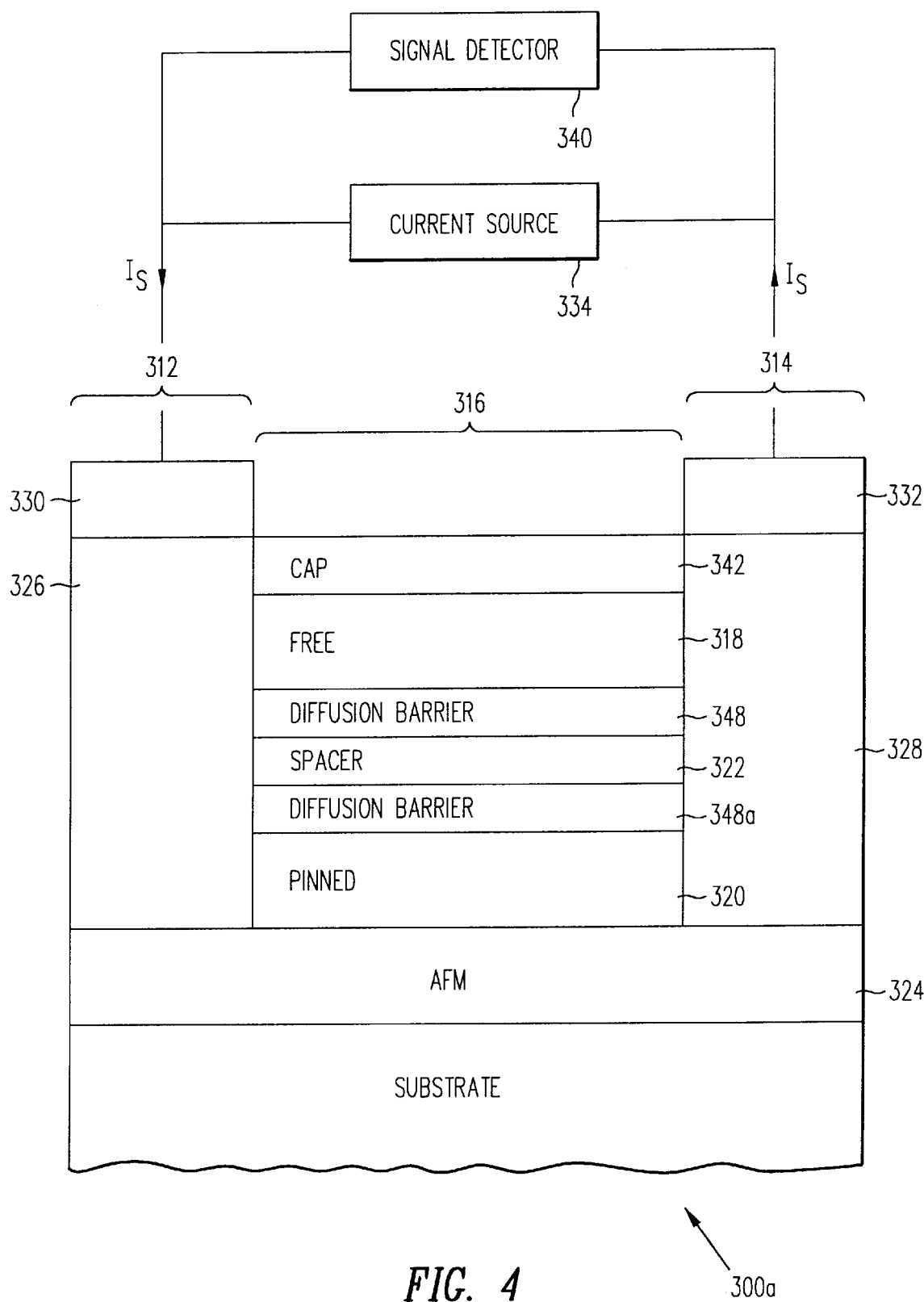
FIG. 4 is an air bearing surface view of a variation of the inventive improved spin valve head having a second diffusion barrier therein.

Just one example of an alternate construction is illustrated in the view of FIG. 4. An alternate improved spin valve sensor 300a is much like the previously described improved spin valve sensor 300 discussed herein in relation to FIG. 3, except that the alternate improved spin valve sensor 300a has a second diffusion barrier 348a between the spacer 322 and the pinned layer 320.

INDUSTRIAL APPLICABILITY

The inventive improved spin valve 300 is intended to be widely used for read heads in modern high capacity disk drives. According to the inventor's findings, decreased amplitude output of spin valve sensors has been caused by heat treatment is required during several aspects of the manufacture of the SV sensor. It is known that longer term thermal treatment, even at relatively low temperatures (around 100° C.), can degrade performance of the spin valve. Output amplitude typically drops by about 30%, and this degradation (amplitude loss) cannot be recovered by a pinned layer reset. However, this lost amplitude can be regained by higher drive field. This observation has suggested that this amplitude loss is related to the magnetic hardening of the free layer 318. This hardening is most likely due to interdiffusion between the "Cu" spacer layer 322 and the NiFe free layer 318.

The inventor has found that it is likely that at the temperatures involved, the diffusion between the "Cu" spacer layer 322 and the NiFe free layer 318 occurs through the grain boundaries present at the interface therebetween. Grain boundary diffusion is known to be an order of magnitude higher than bulk diffusion for most polycrystalline metallic systems.

According to the present invention, grain boundaries are removed by using a very thin layer of amorphous metal between the "Cu" spacer 322 and the NiFe free layer 318. This diffusion inhibitor layer 348 must satisfy the following conditions:

1. Maintain high GMR coefficient
2. Maintain magnetic softness of the free layer
3. Exhibit high corrosion resistance
4. Near zero magnetostriction The CoFeNb combination, described as the embodiment herein, satisfies these conditions.

All of the above are only some of the examples of available embodiments of the present invention. Those skilled in the art will readily observe that numerous other modifications and alterations may be made without departing from the spirit and scope of the invention.

Accordingly, this disclosure is not intended as limiting and the appended claims are to be interpreted as encompassing the entire scope of the invention.

Since the improved spin valve 300 of the present invention may be readily produced and integrated into existing magnetic disc drive systems and devices, and since the advantages as described herein are provided, it is expected that it will be readily accepted in the industry. For these and other reasons, it is expected that the utility and industrial applicability of the invention will be both significant in scope and long-lasting in duration.

What is claimed is:

1. A thin film magnetoresistive (MR) spin valve read sensor comprising:

a pinned layer;

a spacer layer;

a diffusion barrier layer being disposed upon said spacer layer, said diffusion barrier layer being composed of an amorphous material comprised of CoFeX, wherein X is an element selected from the group consisting of Nb, Zr and Hf;

a free layer being disposed upon said diffusion barrier layer and being composed of a crystalline ferromagnetic material.

2. The sensor of claim 1, wherein:

said element X comprises between two percent and ten percent of said diffusion barrier layer.

3. The sensor of claim 2 wherein:

said diffusion barrier layer is made up of generally 90% Co, 5% Fe and 5% X.

4. A thin film magnetoresistive (MR) spin valve read sensor, comprising:

a pinned layer;

a spacer layer;

a first diffusion barrier layer being disposed upon said spacer layer, said first diffusion barrier layer being composed of an amorphous material comprised of CoFeX, wherein X is an element selected from the group consisting of Nb, Zr and Hf;

a free layer being disposed upon said diffusion barrier layer and being composed of a crystalline ferromagnetic material;

a second diffusion barrier layer being disposed upon said pinned layer, and wherein said spacer layer is disposed upon said second diffusion barrier layer; said second diffusion barrier layer being composed of an amorphous material and being comprised of CoFeY, wherein Y an element is selected from the group consisting of Nb, Zr and Hf.

5. The spin valve read sensor of claim 4, and further including:

an antiferromagnetic layer adjacent to said pinned layer.

6. The spin valve read sensor of claim 4, wherein:

said element X comprises between two percent and ten percent of said first diffusion barrier layer, and said element Y comprises between two percent and ten percent of said second diffusion barrier layer.

7. A magnetic disk drive comprising:

at least one rotating magnetic medium;

a slider;

a positioning coil for positioning said slider; and a head affixed to said slider such that said head may be positioned relative to said at least one rotating magnetic medium by the action of moving said slider with said positioning coil; wherein said head includes a spin valve sensor having
      a pinned layer;
      a spacer layer;
      a diffusion barrier layer being disposed upon said spacer layer, said diffusion barrier layer being composed of an amorphous material comprised of CoFeX, wherein X is an element selected from the group consisting of Nb, Zr and Hf;
      a free layer being disposed upon said diffusion barrier layer and being composed of a crystalline ferromagnetic material.

8. The magnetic disk drive of claim 7, wherein:

said element X comprises between two percent and ten percent of said diffusion barrier layer.

9. The magnetic disk drive of claim 8, wherein:

said diffusion barrier layer is made up of generally 90% Co, 5% Fe and 5% X.

10. The magnetic disk drive of claim 7, wherein:

the spacer layer includes copper.

* * * * *